(12) United States Patent
Kim et al.

(10) Patent No.: US 7,492,802 B2
(45) Date of Patent: Feb. 17, 2009

(54) END PUMPING VERTICAL EXTERNAL CAVITY SURFACE EMITTING LASER APPARATUS

(75) Inventors: Jun-youn Kim, Suwon-si (KR); Ki-sung Kim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/508,166

(22) Filed: Aug. 23, 2006

(65) Prior Publication Data

US 2007/0147455 A1 Jun. 28, 2007

(30) Foreign Application Priority Data

Dec. 24, 2005 (KR) .................. 10-2005-0129124

(51) Int. Cl.
*H01S 5/00* (2006.01)
*H01S 3/08* (2006.01)
(52) U.S. Cl. .................. 372/50.11; 372/50.124; 372/99

(58) Field of Classification Search ............. 372/50.11, 372/50.124, 99
See application file for complete search history.

(56) References Cited

U.S. PATENT DOCUMENTS

| 5,206,872 A | * | 4/1993 | Jewell et al. ............. 372/50.11 |
| 2007/0058688 A1 | * | 3/2007 | Kim et al. ............. 372/50.124 |

* cited by examiner

*Primary Examiner*—Armando Rodriguez
(74) *Attorney, Agent, or Firm*—Buchanan Ingersoll & Rooney PC

(57) ABSTRACT

Provided is a vertical cavity external surface emitting laser (VECSEL) apparatus in which incidence loss of a pumping beam can be reduced. The VECSEL apparatus includes: a laser chip including: an anti-reflection coating (ARC) layer to which a pumping beam is incident; a low Herpin Index distributed Bragg reflector (LHI-DBR) having a LHI stack structure; and a periodic gain layer that is formed on the LHI-DBR and generates laser light by being excited by the pumping beam; and an external cavity mirror that is installed outside the laser chip and faces the periodic gain layer and constitutes a laser cavity with the LHI-DBR.

14 Claims, 8 Drawing Sheets

END PUMPING VERTICAL EXTERNAL CAVITY SURFACE EMITTING LASER APPARATUS

CROSS-REFERENCE TO RELATED PATENT APPLICATION

Priority is claimed to Korean Patent Application No. 10-2005-0129124, filed on Dec. 24, 2005 in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface-emitting laser (VECSEL) apparatus, and more particularly, to a VECSEL apparatus having an improved structure to reduce the incidence loss of the pumping beam.

2. Description of the Related Art

A vertical cavity surface-emitting laser (VCSEL) emits a very narrow spectrum during single longitudinal operation and has high coupling efficiency since its projection angle is small. Other apparatuses can be easily integrated with the VCSEL due to the surface emitting structure of the VCSEL. Thus, VCSELs can be used for pumping laser diodes (LDs).

However, the width of an emission region of the VCSEL must be less than 10 µm for a general horizontal operation of the VCSEL. Even then, since the VCSEL can be easily changed into a multiple mode due to a thermal lens effect according to an increased light output, the maximum output generally is not greater than 5 mW during a single longitudinal operation.

A vertical external cavity surface-emitting laser (VECSEL) device has been suggested to enhance the above-described advantages of the VCSEL and realize high output. In the VECSEL, a gain region can be increased by replacing an upper distributed Bragg reflector (DBR) layer with an external mirror, and an output of 100 mW or more can be obtained. Recently, because it is difficult to obtain sufficient gain in a surface-emitting laser due to small gain volume compared to an edge emitting laser, a VECSEL device having a periodic gain structure in which quantum wells are periodically placed has been developed. Also, as it is limited to uniformly inject carriers into a large area by electric pumping, a VECSEL device has been developed in which a large area is pumped uniformly with carriers by optical pumping in order to obtain high output.

FIG. 1 is a schematic cross-sectional view of a conventional end pumping VECSEL apparatus. FIG. 2 is a graph of the reflectivity of a DBR layer according to the wavelength of the pumping beams in the VECSEL apparatus of FIG. 1.

Referring to FIG. 1, the conventional VECSEL includes a transparent substrate 2, a DBR layer 4 stacked on the transparent substrate 2, a periodic gain layer 6 stacked on the DBR layer 4, an optical pump 9 installed to radiate a pumping beam to the transparent substrate, and an external cavity mirror 8 installed to face the periodic gain layer 6. The DBR layer 4 has a stack structure of H, L, H, L, H, L . . . or L, H, L, H, L, H . . . Here, L denotes a low refractive index layer having a wavelength of λ/4, and H denotes a high refractive index layer, and λ is a wavelength of the laser light generated in the periodic gain layer 6.

In the conventional VECSEL apparatus having the above described configuration, more than 30% of the pumping beam light incident at an interface or on a surface of the DBR layer 4 is reflected and thus the incidence pumping efficiency in the gain region is relatively low, that is, about 70%. Referring to FIG. 2, when a pumping beam has a wavelength of 808 nm, about 30% of the pumping beam light is reflected at an interface of the DBR layer 4. Thus, reflection of the incident pumping beam at an interface of the DBR layer 4 reduces the gain efficiency and the lasing efficiency. Accordingly, a VECSEL apparatus having an improved structure to reduce the incidence loss to increase the pumping beam efficiency is required.

SUMMARY OF THE DISCLOSURE

The present disclosure provides a vertical external cavity surface-emitting laser (VECSEL) apparatus having an improved structure in which incidence loss of pumping beam light can be reduced.

According to an aspect of the present disclosure, there is provided a VECSEL apparatus comprising: a laser chip comprising: an anti-reflection coating (ARC) layer to which a pumping beam is incident; a low Herpin Index distributed Bragg reflector (LHI-DBR) having a LHI stack structure; and a periodic gain layer that is formed on the LHI-DBR and generates laser light by being excited by the pumping beam; and an external cavity mirror that is installed outside the laser chip to face the periodic gain layer and constitutes a laser cavity with the LHI-DBR.

The LHI stack structure may be expressed as $$\left(\frac{L}{2} H \frac{L}{2}\right)^N,$$

where the wavelength of the laser light is λ, L is a low reflectivity layer having a thickness of λ/4, H is a high reflectivity layer having a thickness of λ/4, and N is an integer of stack repetition which is greater than 0. The low reflectivity layer and the high reflectivity layer may be respectively formed of AlGaAs and AlAs. The periodic gain layer may comprise a plurality of quantum well layers and barrier layers. The ARC layer may be formed of a light-transmissive insulating material such as $SiO_2$, $TiO_2$, or $Al_2O_3$. The thickness of the ARC layer may be one fourth of the wavelength $\lambda_o$ of the pumping beam. The ARC layer may have a single-layer structure or a multi-layer structure.

An optical pump may be further installed to radiate the pumping beam to the ARC layer. A wavelength $\lambda_o$ of the pumping beam may be in the range of 700 to 900 nm. The LHI-DBR may have low reflectivity with respect to the pumping beam.

A heat spreader that absorbs heat generated in the laser chip and dissipates the heat to the outside of the laser chip may be further included. The heat spreader may be formed on the periodic gain layer or between the LHI-DBR and the ARC layer. The heat spreader may be formed of one selected material from the group consisting of diamond, silicon carbide (SiC), and $Al_2O_3$.

According to the present disclosure, a VECSEL with improved light output and lasing efficiency in the gain region can be obtained.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

Figure 1:
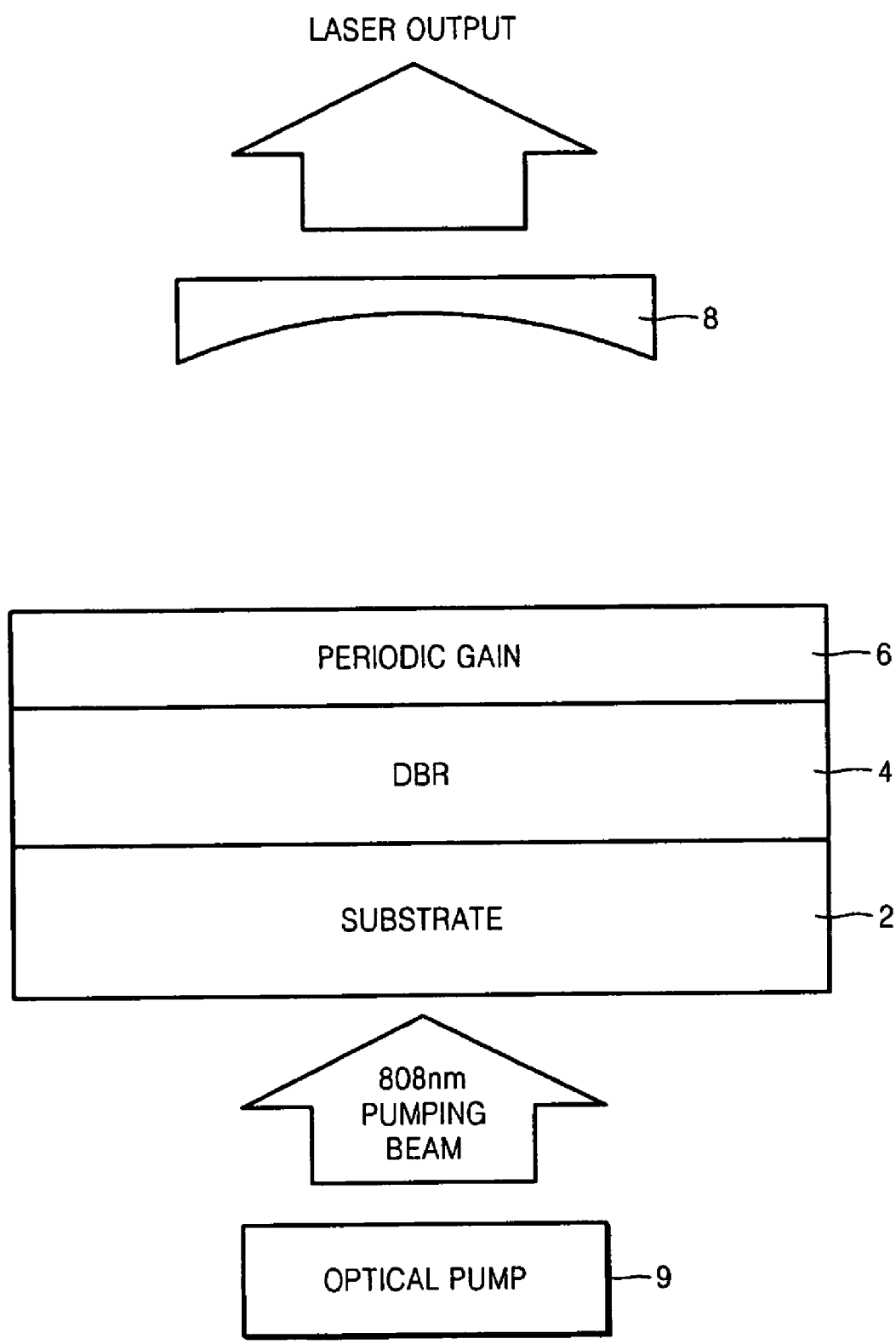
FIG. 1 is a cross-sectional view of a conventional end pumping vertical external cavity surface-emitting laser (VECSEL) apparatus.
Figure 2:
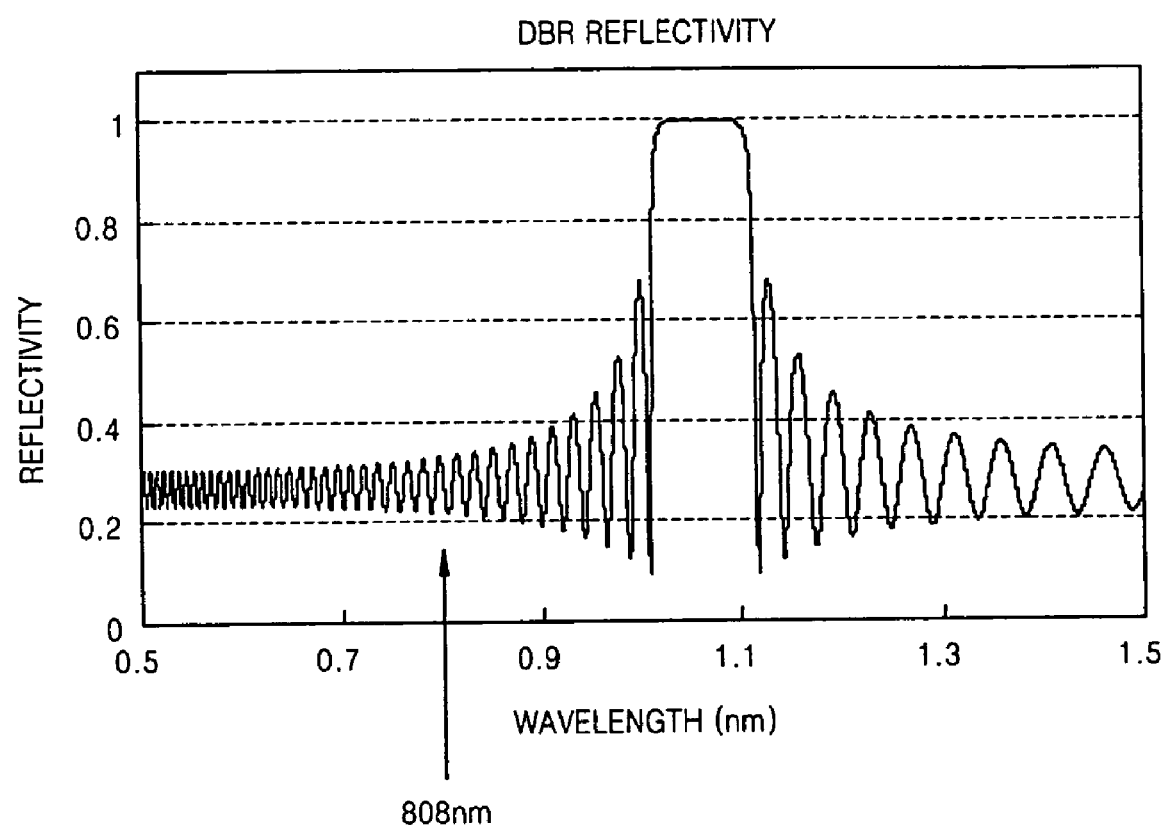
FIG. 2 is a graph illustrating the reflectivity of a distributed Bragg reflector (DBR) layer according to the wavelength of the pumping beam in the VECSEL apparatus of FIG. 1.

The present disclosure will now be described more fully with reference to the accompanying drawings, in which exemplary embodiments of the disclosure are shown. In the drawings, the thicknesses of layers and regions are exaggerated for clarity.

Figure 3:
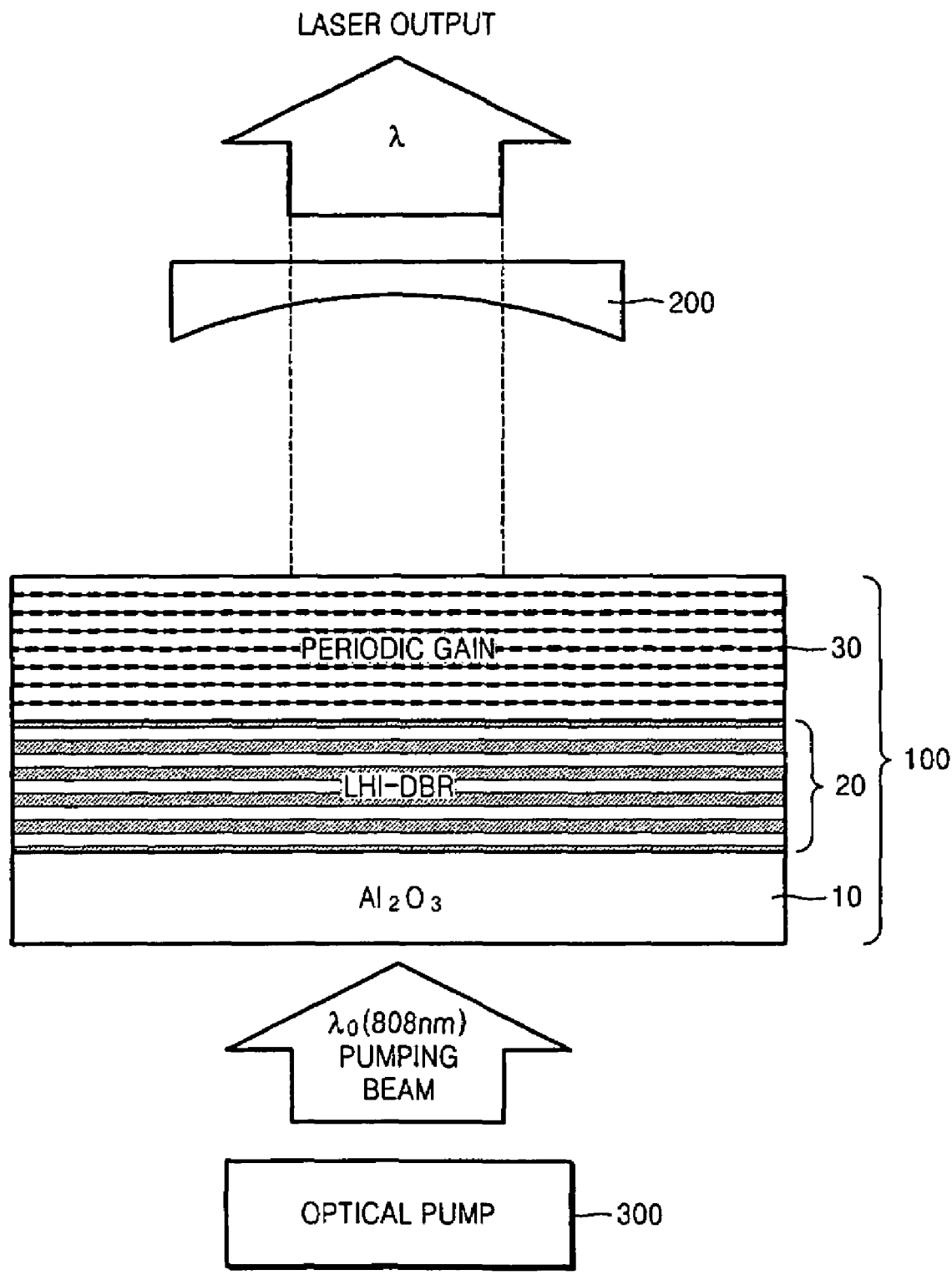
FIG. 3 is a cross-sectional view of a VECSEL apparatus according to an embodiment of the present disclosure.
Figure 4:
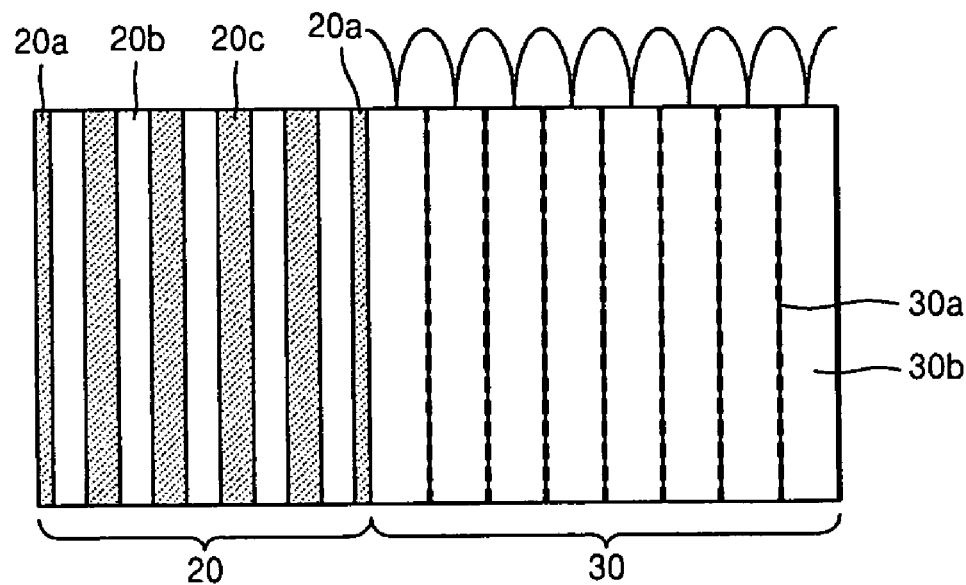
FIG. 4 is a schematic view of a low Herpin index distributed Bragg reflector (LHI-DBR) of the VECSEL apparatus of FIG. 3.

FIG. 3 is a cross-sectional view of a VECSEL apparatus according to an embodiment of the present disclosure; FIG. 4 is a schematic view of a low Herpin index distributed Bragg reflector (LHI-DBR) of the VECSEL apparatus of FIG. 3.

Referring to FIGS. 3 and 4, the VECSEL apparatus of the present embodiment includes a laser chip 100 including an anti-reflection coating (ARC) layer 10, a low Herpin index distributed Bragg reflector (LHI-DBR) 20, and a periodic gain layer 30, an optical pump 300 radiating a pumping beam to the ARC layer 10 of the laser chip 100, and an external cavity mirror 200 that is disposed to face the periodic gain layer 30 and constitutes a laser cavity with the LHI-DBR.

The periodic gain layer 30 is excited by the pumping beam incident from the optical pump 300 and thus generates laser light, and has a multi-quantum well structure including a plurality of quantum well layers 30a and barrier layers 30b. Since the structure, the material, and the forming method of the periodic gain layer 30 are well known in the art, descriptions thereof will be omitted. A wavelength $\lambda_0$ of the pumping beam is in the range of 700 to 900 nm in this exemplary embodiment.

The LHI-DBR 20 is a high reflectivity mirror layer that forms a cavity with the external cavity mirror 200, and the laser light generated in the periodic gain layer 30 can be resonated and amplified between the external cavity mirror 200 and the LHI-DBR 20.

The LHI-DBR 20 of the VECSEL apparatus of the present embodiment is formed of a DBR having a low Herpin index (LHI) stack structure which is expressed as $$\left(\frac{L}{2} H \frac{L}{2}\right)^N,$$

where the wavelength of the laser light is $\lambda$, L is a low reflectivity layer with a thickness of $\lambda/4$, H is a high reflectivity layer with a thickness of $\lambda/4$, and N is a positive non-zero integer of stack repetition. Referring to FIG. 4, the LHI-DBR layer 20 expressed above includes low reflectivity layers 20a, that is, L/2, and with a thickness of $\lambda/8$, respectively formed in the top and bottom layers, and high reflectivity layers 20b and low reflectivity layers 20c with a thickness of $\lambda/4$ are stacked alternately therebetween (between the top and bottom layers of the LHI-DBR 20). The high reflectivity layers (20b) and low reflectivity layers (20a, 20c) may be formed of, for example, AlGaAs and AlAs.

The structure of the LHI-DBR 20 has a strictly different structure from the H, L, H, L, H, L, . . . or L, H, L, H, L, H . . . stack structure of a conventional DBR structure.

Since the LHI-DBR 20 having an LHI stack structure has a low reflectivity within 2% with respect to the pumping beam in the range of 700 to 900 nm, the incidence pumping efficiency in the gain region can be increased from 70% in the conventional VECSEL apparatus to more than 98%. Accordingly, the incidence loss of the pumping beam is reduced compared to the conventional VECSEL apparatus and thus the light output and lasing efficiency in the gain region can be improved. Accordingly, the light output of the VECSEL apparatus according to the current embodiment of the present disclosure can be increased significantly.

The ARC layer 10 may be formed of a light-transmissive insulating material such as $SiO_2$, $TiO_2$, or $Al_2O_3$ and is formed to a thickness of one fourth of the wavelength $\lambda_0$ of the pumping beam to suppress the reflection of the pumping beam on a surface of the LHI-DBR 20. The ARC layer may have a single-layer structure or a multi-layer structure.

In the above described VECSEL apparatus, the pumping beam emitted from the optical pump 300 is transmitted through the ARC layer 10 and the LHI-DBR 20 and is absorbed in the periodic gain layer 30, in detail, the quantum well layer 30a, and accordingly, electrons and holes excited in the quantum well layer 30a are recombined and thus laser light can be emitted. As illustrated in FIG. 4, the emitted laser light generates a standing wave between the LHI-DBR 20 and the external cavity mirror 30. In order to maximize the gain efficiency of the laser light, the quantum well layer 30a may be disposed at an anti-node of the standing wave, that is, a position where the displacement is the greatest.

The wavelength $\lambda$ of the laser light generated in the periodic gain layer 30 may be varied according to the composition ratio of the material forming the quantum well layer 30a or the thickness of the quantum well layer 30a. Therefore, by adjusting these two factors, that is, the composition ratio and the thickness, laser light having a desired wavelength can be obtained.

A laser chip for the above-described VECSEL apparatus is fabricated as follows. First, a base substrate (not shown) is provided, and then an ARC layer 10, an LHI-DBR 20, and a periodic gain layer 30 are sequentially formed. Each layer can be formed using ordinary thin layer deposition methods, such as chemical vapor deposition (CVD) or physical vapor deposition (PVD). Then, the base substrate is removed using a method such as chemical mechanical polishing (CMP). A wet etching process may be further performed after CMP in some cases.

Figure 5:
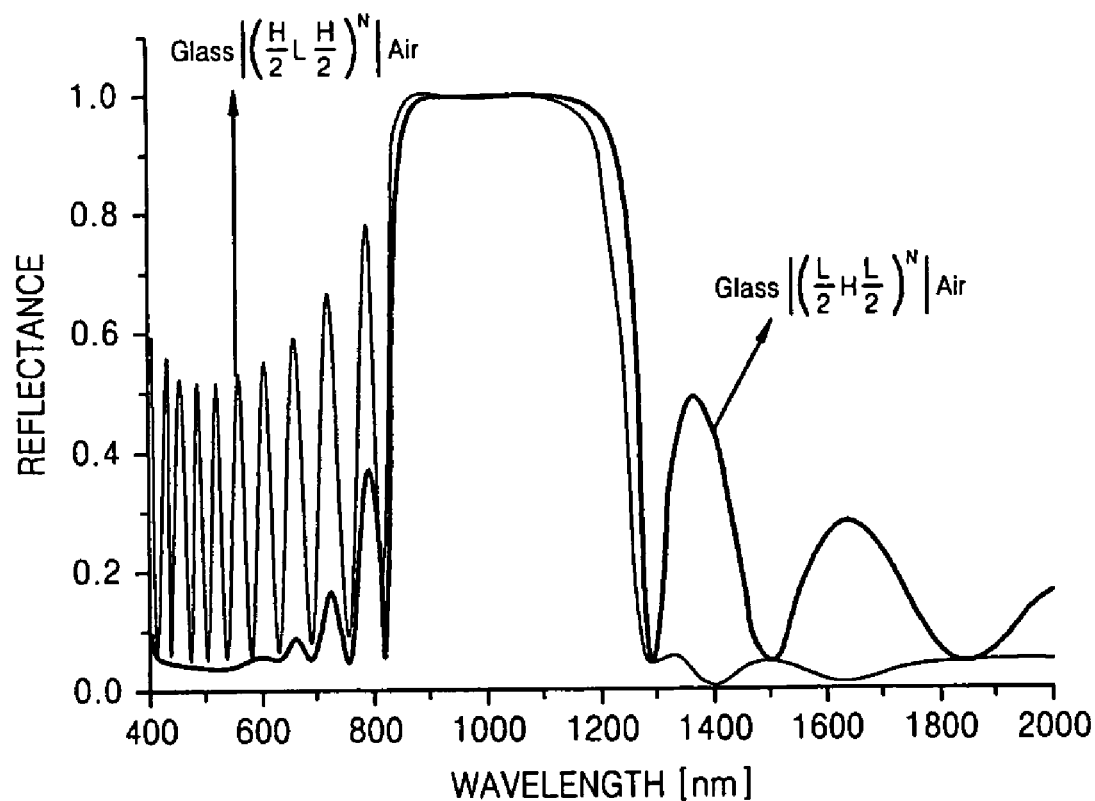
FIG. 5 is a graph illustrating the reflectivity of the LHI-DBR and a high Herpin index distributed Bragg reflector (HHI-DBR) in comparison.

FIG. 5 is a graph illustrating the reflectivity of the LHI-DBR 20 and a high Herpin index distributed Bragg reflector (HHI-DBR) in comparison. The HHI-DBR has a stack structure which is expressed as $$\left(\frac{H}{2}L\frac{H}{2}\right)^N.$$

Referring to FIG. 5, the LHI-DBR 20 has better reflectivity than the HHI-DBR in the short wavelength range, that is, from 700 to 900 nm. In the long wavelength range, that is, from 1400 to 2000 nm, the HHI-DBR has better reflectivity than the LHI-DBR 20.

Figure 6:
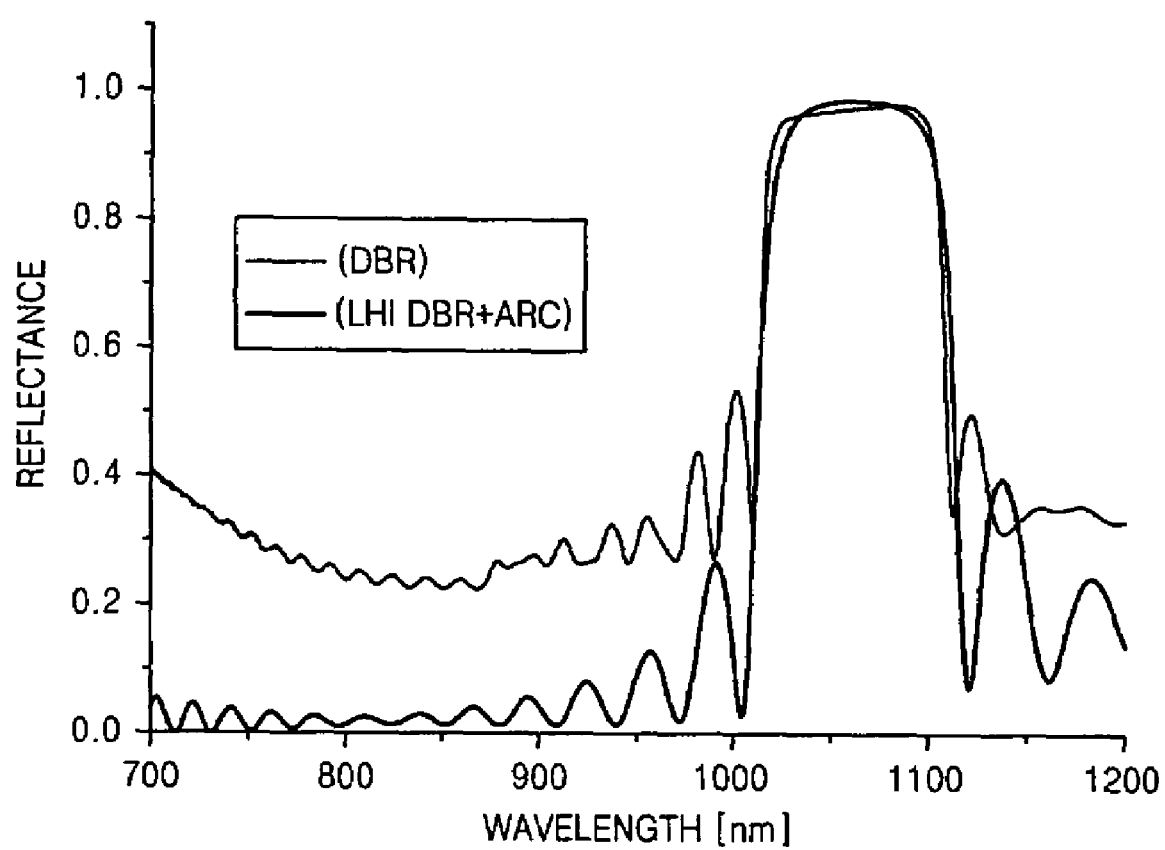
FIG. 6 illustrates the reflectivity of the LHI-DBR according to the wavelength of a pumping beam in the VECSEL apparatus of FIG. 3.

FIG. 6 illustrates the reflectivity of the LHI-DBR 20 according to the wavelength of the pumping beam in the VECSEL apparatus of FIG. 3 compared to the reflectivity of the conventional DBR having a stack structure of H, L, H, L, H, L or L, H, L, H, L, H . . .

Figure 7:
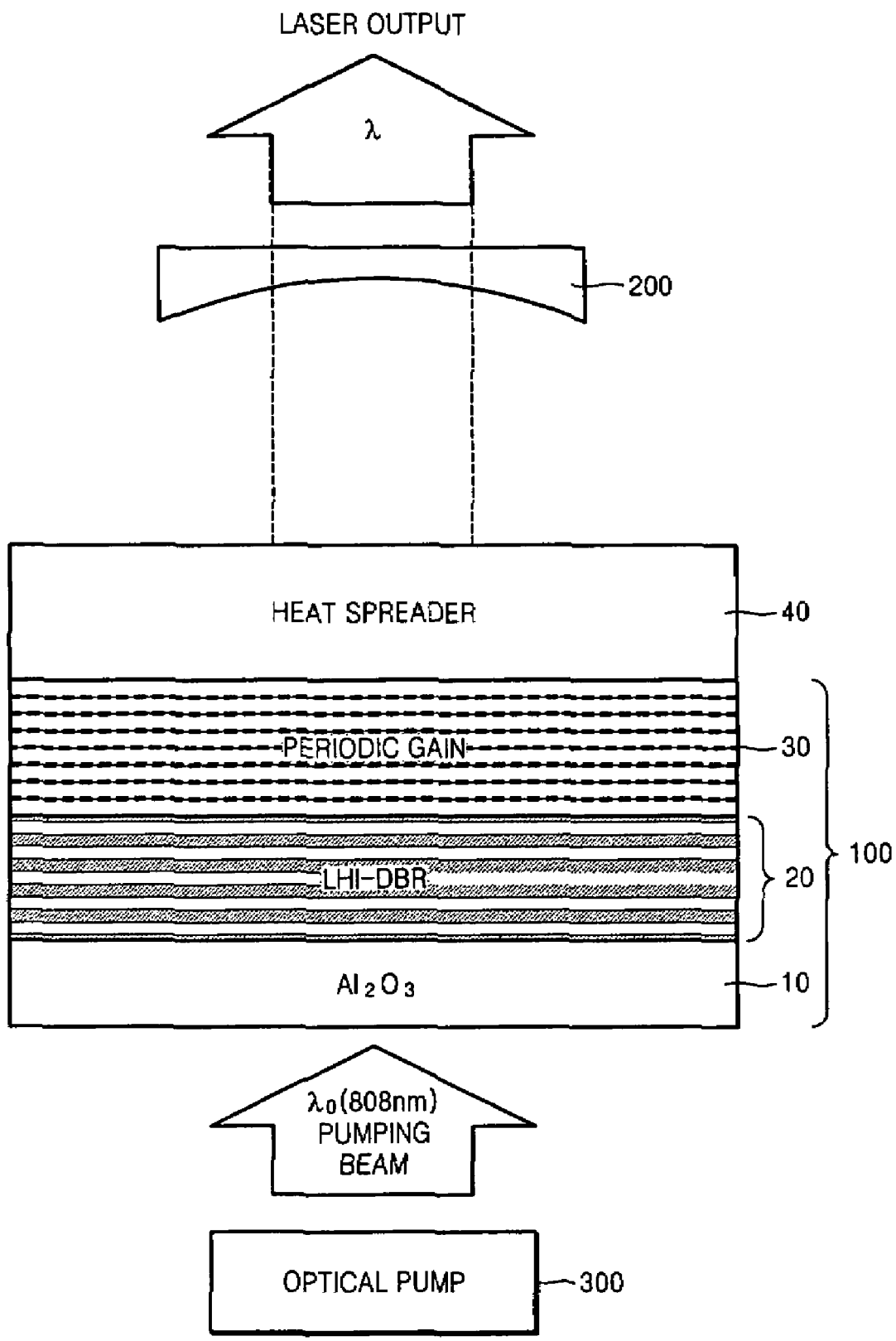
FIG. 7 is a schematic view of a VECSEL apparatus according to another embodiment of the present disclosure.
Figure 8:
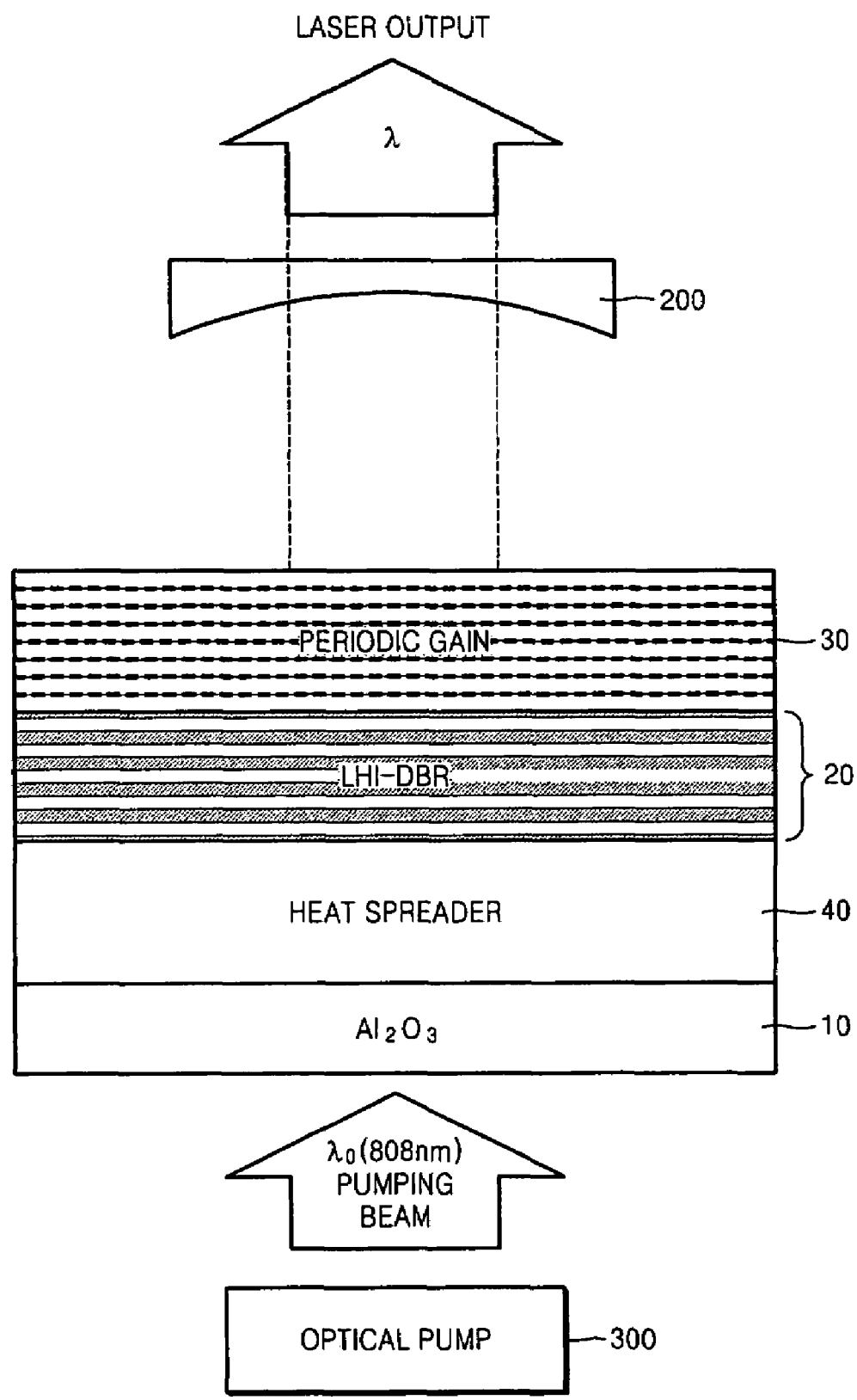
FIG. 8 is a schematic view of a VECSEL apparatus according to another embodiment of the present disclosure.
Figure 9:
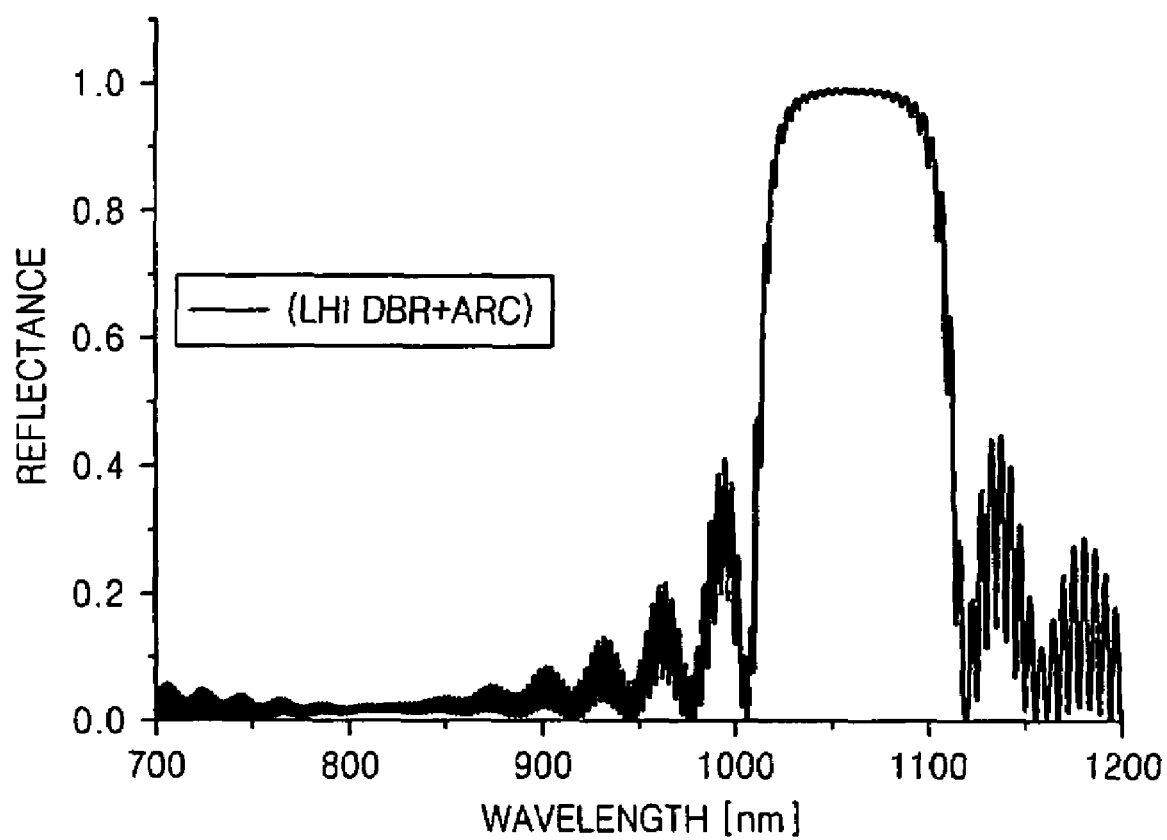
FIG. 9 illustrates the reflectivity of the LHI-DBR according to the wavelength of a pumping beam in the VECSEL apparatus of FIG. 8.

FIG. 7 is a schematic view of a VECSEL apparatus according to another embodiment of the present disclosure. FIG. 8 is a schematic view of a VECSEL apparatus according to another embodiment of the present disclosure; and FIG. 9 illustrates the reflectivity of a LHI-DBR 20 according to the wavelength of a pumping beam in the VECSEL apparatus of FIG. 8.

Descriptions of components common to the present and previous embodiments will not be repeated and the same reference numerals will be used. The VECSEL apparatuses according to the embodiments of the present disclosure as illustrated in FIGS. 7 and 8 have almost the same configuration as the VECSEL apparatus of FIG. 3, but further include a heat spreader 40 which absorbs heat generated in the laser chip 100 and dissipates the heat to the outside. The heat spreader 40 is a heat sink formed of diamond, silicon carbide (SiC), or $Al_2O_3$.

In the VECSEL apparatus of FIG. 7, the heat spreader 40 is formed on the periodic gain layer 30 and the heat spreader 40 and the periodic gain layer 30 are bonded to each other by a Van der Waals Force.

In the VECSEL apparatus of FIG. 8, the heat spreader 40 is formed between the LHI-DBR 20 and the ARC layer 10. A laser chip in the VECSEL apparatus of FIG. 8 can be manufactured using the following process. First, a base substrate (not shown) is provided, and then, the LHI-DBR 20 and the periodic gain layer 30 are sequentially formed. Next, the base substrate is removed using a CMP process. After the heat spreader 40 is formed, an ARC layer 10 is formed on a surface of the heat spreader 40. Then another surface of the heat spreader 40 is bonded to the LHI-DBR 20. The laser chip of FIG. 8 can be manufactured in this manner.

According to the present disclosure, the reflectivity of the incident pumping beam in the DBR during the driving of the VECSEL apparatus is reduced to within 2%, and particularly, ripple in the incident beam wavelength range, that is, 700 to 900 nm, can be reduced significantly. Accordingly, the transmittance of the pumping beam is maximized and the pumping efficiency incident in the gain region can be increased from 70% to more than 98%.

As the incidence loss of the pumping beam is reduced and the pumping efficiency is improved, light output and lasing efficiency in the gain region can be improved and accordingly, the light output of the VECSEL apparatus can be increased. Also, as it is easy to manufacture the VECSEL apparatus according to the present disclosure, manufacturing costs can be reduced as well.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical external cavity surface-emitting laser (VECSEL) apparatus comprising:
    a laser chip comprising:
        an anti-reflection coating (ARC) layer to which a pumping beam is incident;
        a low Herpin Index distributed Bragg reflector (LHI-DBR) having a LHI stack structure; and
        a periodic gain layer that is formed on the LHI-DBR and generates laser light by being excited by the pumping beam; and
        an external cavity mirror that is installed outside the laser chip to face the periodic gain layer and constitutes a laser cavity with the LHI-DBR.

2. The VECSEL apparatus of claim 1, wherein the LHI stack structure is expressed as $$\left(\frac{L}{2}H\frac{L}{2}\right)^N,$$

where the wavelength of the laser light is $\lambda$, L is a low reflectivity layer having a thickness of $\lambda/4$, H is a high reflectivity layer having a thickness of $\lambda/4$, and N is an integer of stack repetition which is greater than 0.

3. The VECSEL apparatus of claim 2, wherein the low reflectivity layer and the high reflectivity layer are respectively formed of AlGaAs and AlAs.

4. The VECSEL apparatus of claim 1, further comprising an optical pump installed to radiate the pumping beam to the ARC layer.

5. The VECSEL apparatus of claim 4, wherein a wavelength $\lambda_0$ of the pumping beam is in the range of 700 to 900 nm.

6. The VECSEL apparatus of claim 5, wherein the LHI-DBR has low reflectivity with respect to the pumping beam.

7. The VECSEL apparatus of claim 1, wherein the periodic gain layer comprises a plurality of quantum well layers and barrier layers.

8. The VECSEL apparatus of claim 1, wherein the ARC layer is formed of a light-transmissive insulating material.

9. The VECSEL apparatus of claim 8, wherein the thickness of the ARC layer is one fourth of the wavelength $\lambda_0$ of the pumping beam.

10. The VECSEL apparatus of claim 9, wherein the ARC layer has a single-layer structure or a multi-layer structure.

11. The VECSEL apparatus of claim 10, wherein the light-transmissive material is one selected from the group consisting of $SiO_2$, $TiO_2$, and $Al_2O_3$.

12. The VECSEL apparatus of claim 1, further comprising a heat spreader that absorbs heat generated in the laser chip and dissipates the heat to the outside of the laser chip.

13. The VECSEL apparatus of claim 12, wherein the heat spreader is formed of one material selected from the group consisting of diamond, silicon carbide (SiC), and $Al_2O_3$.

14. The VECSEL apparatus of claim 12, wherein the heat spreader is formed on the periodic gain layer or between the LHI-DBR and the ARC layer.

* * * * *